(12) United States Patent
Hu et al.

(10) Patent No.: US 8,581,117 B2
(45) Date of Patent: Nov. 12, 2013

(54) CONDUCTIVE SUBSTRATE FOR FORMATION OF LED PACKAGE STRUCTURES THEREON

(75) Inventors: Pi-Chiang Hu, Hsinchu (TW); Kai-Lun Wang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 133 days.

(21) Appl. No.: 13/366,371

(22) Filed: Feb. 6, 2012

(65) Prior Publication Data
US 2012/0217046 A1    Aug. 30, 2012

(30) Foreign Application Priority Data
Feb. 28, 2011  (CN) .......................... 2011 1 0047317

(51) Int. Cl.
*H01L 23/28* (2006.01)
(52) U.S. Cl.
USPC ........................................................ 174/521
(58) Field of Classification Search
USPC ................................................ 174/521–534
See application file for complete search history.

(56) References Cited

U.S. PATENT DOCUMENTS

| | | | | |
|---|---|---|---|---|
| 4,172,272 A | * | 10/1979 | Schneider | 361/717 |
| 4,899,257 A | * | 2/1990 | Yamamoto | 361/740 |
| 7,751,179 B2 | * | 7/2010 | Irmer et al. | 361/608 |
| 8,157,415 B2 | * | 4/2012 | Tseng et al. | 362/249.02 |
| 2012/0103682 A1 | * | 5/2012 | Chang et al. | 174/529 |

* cited by examiner

*Primary Examiner* — Jeremy Norris
(74) *Attorney, Agent, or Firm* — Altis & Wispro Law Group, Inc.

(57) ABSTRACT

A plurality of conductive areas is formed on a conductive substrate which includes a frame. Each of the conductive areas includes a lead frame and two electrodes. The frame includes a first side and an opposite second side. The lead frame includes first and second lead frame beams. The first and second lead frame beams extend from the first side toward the second side to connect with the two electrodes. The first and second electrodes extend respectively from the first and second lead frame beams. Each conductive area also includes a supporting portion interconnecting the electrodes and the frame to reinforce the connection between the frame and the conductive area so that the conductive area can sustain a pressure when an insulation shell is injection molded on the conductive area.

14 Claims, 3 Drawing Sheets

CONDUCTIVE SUBSTRATE FOR FORMATION OF LED PACKAGE STRUCTURES THEREON

BACKGROUND

1. Technical Field

The disclosure relates to light emitting diodes, and particularly to a conductive substrate for formation of LED package structures thereon.

2. Description of the Related Art

Light emitting diodes are commonly applied in environmental lighting. A conductive substrate for formation of a plurality of common LED packages thereon forms a plurality of conductive areas connected to a frame. Each conductive area includes a lead frame extending from the frame, and an inside electrode unit supported by the lead frame. Then, a plurality of insulation shells is arranged on the conductive areas of the conductive substrate respectively by means of plastic injection molding. Then, the lead frame is cut and bent over the insulation shell to function as external electrodes. Thus, a plurality of bases is formed. Finally, LED chips are arranged within the bases by means of bonding. Each LED chip is electrically connected to a corresponding inside electrode unit each consisting of a positive electrode and a negative electrode. Thereafter the LED chip is encapsulated and a corresponding LED package structure is completed. Nevertheless, when the insulation shell is injection molded on the conductive area of the conductive substrate, the conductive area together with the insulation shell is prone to separate from the frame since the frame has only two bumps engaging with the insulation shell. Furthermore, since there are only two ends of the lead frame fixed on the frame in a cantilevered manner which support the insulation shell, the lead frame is prone to deformation during the plastic injection molding of the insulation shell. Accordingly, the yield of the LED package structures is accordingly vulnerable to reduction.

Therefore, it is desirable to provide a conductive substrate for formation of LED packages thereon which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present conductive substrate which is used for formation of LED package structures thereon. Moreover, in the drawings, like reference numerals designate corresponding parts throughout the views.

DETAILED DESCRIPTION

Embodiments of a conductive substrate for formation of LED packages thereon as disclosed are described with reference to the drawings.

Figure 1:
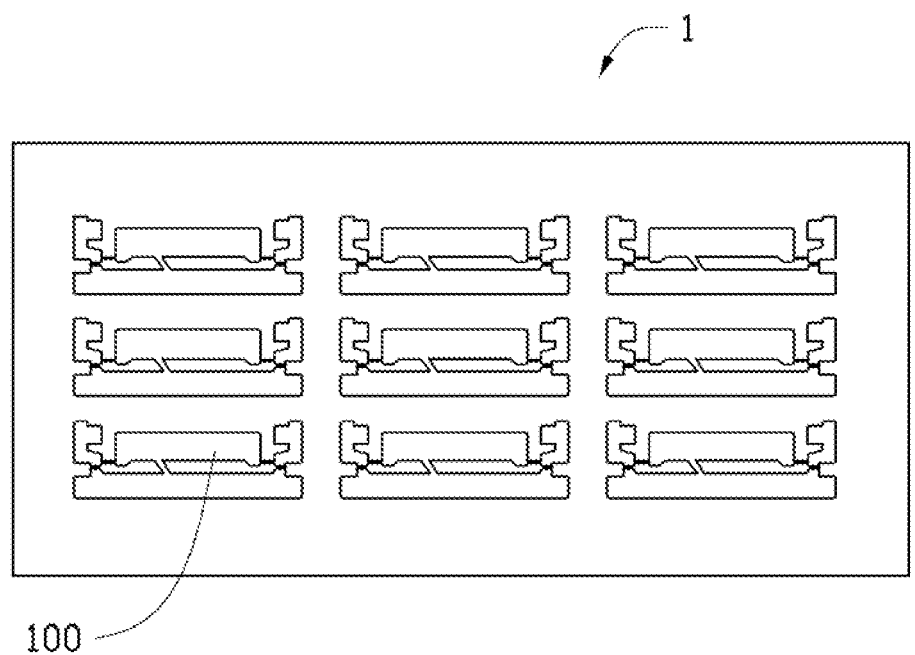
FIG. 1 is a schematic top view of a conductive substrate in accordance with a first embodiment.

Referring to FIG. 1, a conductive substrate 1 for formation of LED package structures thereon includes a plurality of conductive areas 100 distributed in an array. In this embodiment, the plurality of the conductive areas 100 is arranged in three rows and three columns, whereby nine LED package structures each having a configuration like that shown in FIG. 3 can be formed on the conductive substrate 1.

Figure 2:
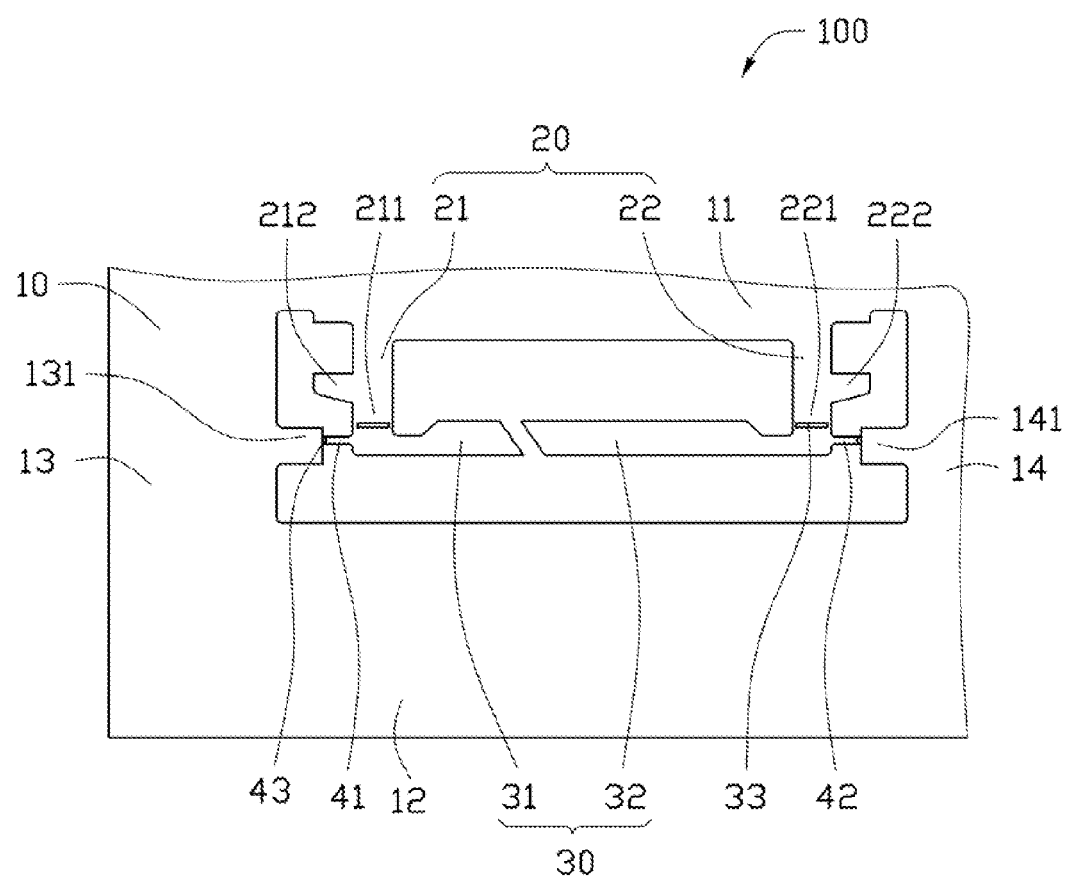
FIG. 2 is an enlarged view of a portion of the conductive substrate of FIG. 1, showing, in more clarity, a conductive area of the conductive substrate.

Referring to FIG. 2, the conductive substrate 1 includes a frame 10, each of the conductive areas 100, a lead frame 20, an inside electrode unit 30, and a supporting portion.

The frame 10 includes a first side 11, a second side 12, a third side 13 perpendicular to the first side 11 and the second side 12, and a fourth side 14 arranged opposite to the third side 13. In this embodiment, a length of the first side 11 and the second side 12 exceeds that of the third side 13 and of the fourth side 14. A portion of the third side 13 and the fourth side 14 extends inwards to form a first protrusion 131 and a second protrusion 141.

The lead frame 20 includes a first lead frame beam 21 and a second lead frame beam 22. The first lead frame beam 21 and the second lead frame beam 22 extend inwards from the first side 11 of the frame 10 toward the second side 12 to connect with the inside electrode unit 30. The first lead frame beam 21 and the second lead frame beam 22 are arranged so as to mirror each other, with a gap therebetween. The first lead frame beam 21 and the second lead frame beam 22 are arranged near the third side 13 and the fourth side 14. In this embodiment, the first lead frame beam 21 and the second lead frame beam 22 extend along a direction perpendicular to the first side 11 and are connected to the first side 11 in a cantilevered manner.

The first lead frame beam 21 has a first free end 211 away from the first side 11. A first horizontal bar 212 perpendicular to the first lead frame beam 21 extends from the center portion of the first lead frame beam 21 to the third side 13. The second lead frame beam 22 has a second free end 221 away from the first side 11. A second horizontal bar 222 relative to the first horizontal bar 212 extends from the center portion of the second lead frame beam 22 to the fourth side 14.

The inside electrode unit 30 includes a first electrode 31 and a second electrode 32. The first electrode 31 and the second electrode 32 are separate, but arranged so as to complement each other. The first electrode 31 and the second electrode 32 extend respectively from the first free end 211 of the first lead frame beam 21 and the second free end 221 of the second lead frame beam 22. In this embodiment, the first electrode 31 extends from the first free end 211 toward the second lead frame beam 22 along a direction parallel to the first side 11. The second electrode 32 extends from the second free end 221 toward the first lead frame beam 21 along a direction parallel to the first side 11.

The first lead frame beam 21 provides longitudinal support to the first electrode 31. The second lead frame beam 22 provides longitudinal support to the second electrode 32. The connection of the first free end 211 and the first electrode 31 and the connection of the second free end 221 and the second electrode 32 each form a long groove 33 parallel to the first side 11. The long groove 33 functions as a preformation for facilitating the precise and easy bending of the first lead frame beam 21 and the second lead frame beam 22 at a later process.

The supporting portion includes a first supporting bar 41 and a second supporting bar 42. The first supporting bar 41 connects to a middle of the first protrusion 131 and the first electrode 31 and is parallel to the first side 11. A width of the first supporting bar 41 is less than that of the first electrode 31. The first supporting bar 41 connects to the first electrode 31 and the frame 10. The first supporting bar 41 horizontally supports the first electrode 31. Similarly, the second supporting bar 42 connects with a middle of the second protrusion 141 and the second electrode 32 and is parallel to the first side 11. A width of the second supporting bar 42 is less than that of the second electrode 32. The second supporting bar 42 connects to the second electrode 32 and the frame 10. The second supporting bar 42 horizontally supports the second electrode 32. The connection of the first supporting bar 41 and the first protrusion 131, and the connection of the second supporting bar 42 and the second protrusion 141 each form a groove 43. This operates to conveniently separate the supporting portion and the frame 10. The groove 43 preferably has a V-shaped profile to facilitate the separation of the first and second supporting bars 41, 42 from the protrusions 131, 141, after a formation of an insulation shell 50 (FIG. 3) on a corresponding conductive area 100.

Figure 3:
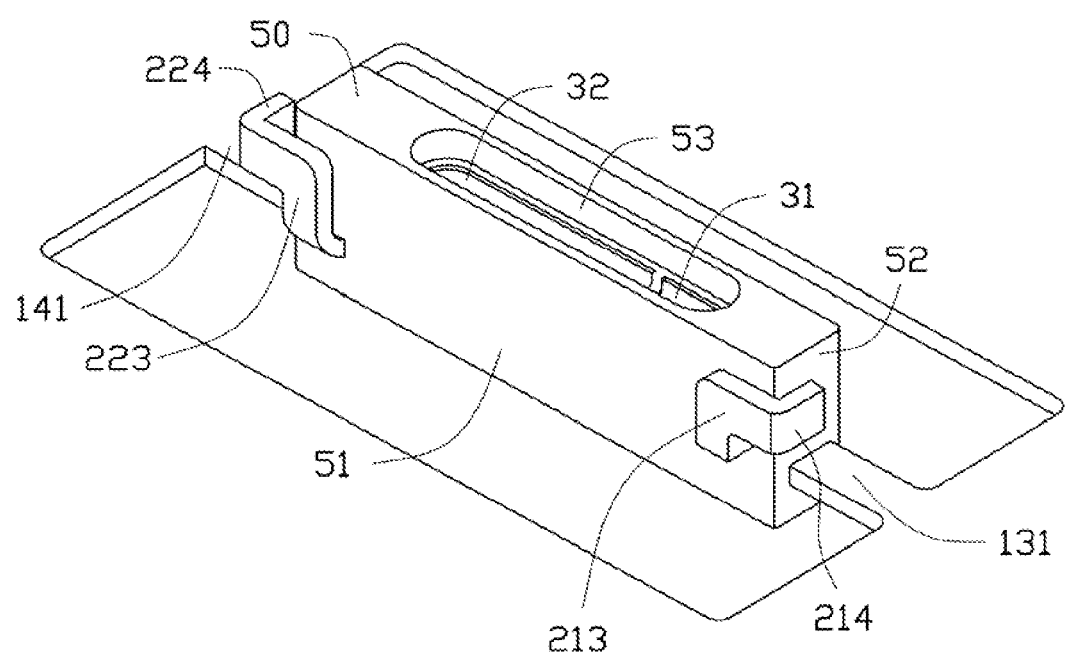
FIG. 3 is a schematic view of an LED package structure obtained on the conductive area of the conductive substrate of FIG. 2.

Referring to FIG. 3, the insulation shell 50 is made of insulating material(s) and formed by means of injection molding. Each of the conductive areas 100 has a corresponding insulation shell 50 formed thereon. The insulation shell 50 includes two opposite side surfaces 51 and two end surfaces 52 perpendicular to the side surfaces 51. The first electrode 31 and the second electrode 32 are surrounded and encapsulated by the two side surfaces 51 and the two end surfaces 52. The two end surfaces 52 of the insulation shell 50 make firm contact with the first protrusion 131 and the second protrusion 141. The connections of the first protrusion 131 and the second protrusion 141 and the first and second supporting bars 41, 42 have the function of helping supporting and fixing the insulation shell 50, to avoid the insulation shell 50 from falling off and the lead frame 20 from deformation when the conductive areas 100 are subjected to a pressure resulted from the injection molding of the insulation shells 50 on the conductive areas 100.

A hollow receiving cavity 53 is arranged within the insulation shell 50. Thus, the first electrode 31 and the second electrode 32 are exposed at a top surface of the insulation shell 50. After the formation of the insulation shells 50, the connections between the lead frames 20 and the frame 10 are severed. Thus, the first lead frame beam 21 passes through the insulation shell 50 from the side surface 51 with a distal end which is free from connection with the frame 10. The first lead frame beam 21 is then bent to include a first bending portion 213 and a second bending portion 214 perpendicular to the first bending portion 213. The first bending portion 213 is a portion of the first lead frame beam 21 attached to the side surface 51 of the insulation shell 50 and extending along a direction of the height of the insulation shell 50. The second bending portion 214 is a portion of the first lead frame beam 21 attached to the end surface 52 of the insulation shell 50 and extending along a direction of the width of the insulation shell 50. The second lead frame beam 22 is similar to the first lead frame beam 21. The second lead frame beam 22 includes a first bending portion 223 and a second bending portion 224. The first bending portion 223 is a portion of the second lead frame beam 22 attached to the side surface 51 of the insulation shell 50 and extending along a direction of the height of the insulation shell 50. The second bending portion 224 is a portion of the second lead frame beam 22 attached to the end surface 52 of the insulation shell 50 and extending along a direction of the width of the insulation shell 50.

Before bending the first lead frame beam 21 and the second lead frame beam 22, the first lead frame beam 21 and the second lead frame beam 22 must be cut at a position along a cut line level with a top side of the first horizontal bar 212, and the second horizontal bar 222 as viewed from FIG. 2 to separate the connection between the frame lead 20 and the frame 10. Regarding the first lead frame beam 21, the first lead frame beam 21 is bent along the long groove 33 in the direction toward the top surface of the insulation shell 50 of FIG. 3 wherein the first lead frame beam 21 is attached tightly to the side surface 51 of the insulation shell 50. The first bending portion 213 is thus formed. Then, the first horizontal bar 212 is bent toward the end surface 52 of the insulation shell 50 and attached tightly the end surface 52. The second bending portion 214 is thus formed. The second lead frame beam 22 is subjected to the same process. The long grooves 33 have a function of allowing the bending the first lead frame beam 21 and the second lead frame beam 22 easily and accurately. The bent first and second lead frame beams 21, 22 are used for electrically mounting the LED package structure to a printed circuit board (not shown) by surface mounting technology (SMT).

Finally, a cut is made along the grooves 43, and the insulation shell 50 and the conductive area 100 are together separated from the frame 10. A plurality of the LED package structures is formed. Before or after that the cut is made along the grooves 43, an LED chip (not shown) can be received in the hollow receiving cavity 53 of the insulation shell 50 and electrically connected to the first and second electrodes 31, 32 of the inside electrode unit 30, and an encapsulation (not shown) can then be filled in the hollow receiving cavity 43 to encapsulate the LED chip. The encapsulation can be made of resin dispersed with fluorescent particles, such as YAG (yttrium aluminum garnet) particles.

During the bending of the lead frame 20, the first supporting bar 41 fixes the first electrode 31 and the frame 10, and the second supporting bar 42 fixes the second electrode 32 and the frame 10. The first electrode 31 and the second electrode 32 are surrounded by the insulation shell 50. Thus, the first supporting bar 41 and the second supporting bar 42 support the insulation shell 50, and this arrangement avoids any deformation of the first lead frame beam 21 and the second lead frame beam 22.

While the disclosure has been described by way of example and in terms of exemplary embodiments, it is to be understood that the disclosure is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A conductive substrate for formation of LED package structures thereon, comprising:
    a frame;
    a plurality of conductive areas connected to the frame, each conductive area comprising a lead frame and an electrode unit, the frame including a first side and a second side opposite the first side, the lead frame including a first lead frame beam and a second lead frame beam, the first lead frame beam and the second lead frame beam extending from the first side toward the second side to connect with first electrode and second electrode of the electrode unit, respectively;
    wherein the conductive area includes a supporting portion, and the supporting portion connects the electrode unit and the frame together to reinforce the connection between the conductive area and the frame, in addition to the connection achieved by the lead frame and the frame.

2. The conductive substrate of claim 1, wherein the supporting portion includes a first supporting bar and a second supporting bar, the first supporting bar is arranged to interconnect the first electrode and the frame and parallel to the first side, and the second supporting bar is arranged to interconnect the second electrode and the frame and parallel to the first side.

3. The conductive substrate of claim 2, wherein a connection of the first supporting bar and the frame and a connection of the second supporting bar and the frame respectively form a groove.

4. The conductive substrate of claim 3, wherein the groove has a V-shaped profile.

5. The conductive substrate of claim 1, wherein the first electrode and the second electrode are separate and arranged so as to complement each other.

6. The conductive substrate of claim 1, wherein the first lead frame beam and the second lead frame beam are perpendicular to the first side and arranged so as to mirror each other.

7. The conductive substrate of claim 2, wherein the frame include a third side and a fourth side perpendicular to the first side and the second side, a first protrusion, and a second protrusion, the first protrusion and the second protrusion are extended respectively inward from the third side and the fourth side of the frame, the first supporting bar interconnects the first electrode and the first protrusion, and the second supporting bar interconnects the second electrode and the second protrusion.

8. The conductive substrate of claim 2, wherein a width of the first supporting bar is less than that of the first electrode, and a width of the second supporting bar is less thane that of the second electrode.

9. A conductive substrate for formation of LED package structures thereon, comprising:
 a frame;
 a plurality of conductive areas connected to the frame, each conductive area comprising a lead frame and an electrode unit, the frame including a first side and a second side opposite the first side, the lead frame including a first lead frame beam and a second lead frame beam, the first lead frame beam and the second lead frame beam connecting with first electrode and second electrode of the electrode unit, respectively, and being disconnected from the frame;
 an insulation shell being formed on the conductive area by injection molding, the insulation shell having a cavity in an upper face thereof, through which the first and second electrodes are exposed, two opposite side faces being extended from two opposite sides of the upper face and two opposite end faces being extended from two opposite ends of the upper face;
 wherein the conductive area includes a supporting portion, and the supporting portion connects the electrode unit and the frame together; and
 wherein the first lead frame beam includes a first bending portion extending over one of the side faces and a second bending portion extending over one of the end faces of the insulation shell.

10. The conductive substrate of claim 9, wherein the second lead frame beam includes a first bending portion extending over the side face and a second bending portion extending over the other one of the end faces of the insulation shell.

11. The conductive substrate of claim 10, wherein a connection of the first lead frame beam and the first electrode and a connection of the second lead frame beam and the second electrode respectively form a groove parallel to the first side.

12. The conductive substrate of claim 9, wherein the supporting portion comprises a first supporting bar and a second supporting bar, the first supporting bar is arranged to interconnect the first electrode and the frame and parallel to the first side, and the second supporting bar is arranged to interconnect the second electrode and the frame and parallel to the first side.

13. The conductive substrate of claim 12, wherein a connection of the first supporting bar and the frame and a connection of the second supporting bar and the frame respectively form a groove.

14. The conductive substrate of claim 13, wherein the groove has a V-shaped profile.

* * * * *